United States Patent
Shimizu et al.

(10) Patent No.: US 7,534,550 B2
(45) Date of Patent: May 19, 2009

(54) POSITIVE RESIST COMPOSITION AND PROCESS FOR FORMATION OF RESIST PATTERNS

(75) Inventors: Hiroaki Shimizu, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/578,230

(22) PCT Filed: Apr. 7, 2005

(86) PCT No.: PCT/JP2005/006865
§ 371 (c)(1), (2), (4) Date: Oct. 11, 2006

(87) PCT Pub. No.: WO2005/101128
PCT Pub. Date: Oct. 27, 2005

(65) Prior Publication Data
US 2007/0166641 A1    Jul. 19, 2007

(30) Foreign Application Priority Data
Apr. 13, 2004   (JP)   ............................. 2004-118284

(51) Int. Cl.
  *G03F 7/00*   (2006.01)
  *G03F 7/004*  (2006.01)
(52) U.S. Cl. ................. 430/270.1; 430/287.1; 430/311; 430/326; 430/330; 430/910; 430/914
(58) Field of Classification Search ............. 430/270.1, 430/287.1, 910, 914, 326, 311, 330
See application file for complete search history.

(56) References Cited

U.S. PATENT DOCUMENTS

| | | | |
|---|---|---|---|
| 6,479,211 B1 | 11/2002 | Sato et al. | |
| 6,492,091 B2 * | 12/2002 | Kodama et al. | 430/270.1 |
| 6,962,766 B2 | 11/2005 | Uenishi et al. | |
| 2002/0009667 A1 | 1/2002 | Nishimura et al. | |
| 2002/0068238 A1 | 6/2002 | Hada et al. | |
| 2002/0098440 A1 * | 7/2002 | Sato et al. | 430/270.1 |
| 2002/0102492 A1 | 8/2002 | Iwai et al. | |
| 2003/0008968 A1 | 1/2003 | Sugeta et al. | |
| 2003/0077543 A1 | 4/2003 | Sato | |
| 2004/0058269 A1 * | 3/2004 | Hada et al. | 430/270.1 |
| 2004/0137378 A1 | 7/2004 | Sugeta et al. | |
| 2006/0257784 A1 * | 11/2006 | Yamagishi et al. | 430/270.1 |

FOREIGN PATENT DOCUMENTS

| | | | |
|---|---|---|---|
| JP | 2003-005374 | | 1/2003 |
| JP | 2003-005375 | | 1/2003 |
| JP | 2003005374 A | * | 1/2003 |
| JP | 2003107752 A | * | 4/2003 |
| JP | 2004-101642 | | 4/2004 |
| JP | 2004-151364 | | 5/2004 |
| JP | 2004-341247 | | 12/2004 |
| JP | 2004-361629 | | 12/2004 |
| JP | 2005-031624 | | 2/2005 |
| JP | 2005-099275 | | 4/2005 |
| JP | 2005-105260 | | 4/2005 |

OTHER PUBLICATIONS

Office Action Issued on Jun. 24, 2008, on the counterpart Japanese Application No. 2004-118284.

\* cited by examiner

*Primary Examiner*—Amanda C. Walke
(74) *Attorney, Agent, or Firm*—Knobbe, Martens, Olson & Bear, LLP

(57) ABSTRACT

A positive resist composition includes a resin component (A) and an acid generator component (B), wherein the component (A) is a copolymer that includes a structural unit (a1) derived from an ($\alpha$-lower alkyl)acrylate ester that contains a monocyclic or polycyclic group-containing acid dissociable, dissolution inhibiting group, a structural unit (a2) derived from an ($\alpha$-lower alkyl)acrylate ester that contains a lactone ring, a structural unit (a3) derived from an ($\alpha$-lower alkyl)acrylate ester that contains a polar group-containing polycyclic group, and a structural unit (a4).

8 Claims, No Drawings

POSITIVE RESIST COMPOSITION AND PROCESS FOR FORMATION OF RESIST PATTERNS

RELATED APPLICATIONS

This application is the U.S. National Phase filing under 35 U.S.C. §371 of PCT/JP2005/006865, filed Apr. 7, 2005, which designated the United States and was published in a language other than English, which claims priority under 35 U.S.C. §119(a)-(d) to Japanese Patent Application No. 2004-118284, filed Apr. 13, 2004. The content of these applications is incorporated herein by reference in their entireties.

TECHNICAL FIELD

The present invention relates to a positive resist composition and a process for the formation of resist patterns.

BACKGROUND ART

Chemically amplified photoresist compositions that use a KrF excimer laser, ArF excimer laser, $F_2$ excimer laser, EUV (extreme ultraviolet light) or EB (electron beam) or the like as a light source (a radiation source) generally include a resin component (A), an acid generator component (B) that generates an acid on irradiation, and an organic solvent (C) that is capable of dissolving these components, as disclosed, for example, in Japanese Unexamined Patent Application, First Publication No. 2002-296779 (patent reference 1).

These types of chemically amplified photoresist compositions require favorable lithography characteristics (including resolution, depth of focus characteristics, and resist pattern shape and the like).

Moreover in recent years, as the demands for higher resolution resist patterns have increased, in addition to the characteristics described above, the photoresist compositions also require improvements beyond the conventionally observed level of defects (surface defects) within the resist pattern following developing.

These defects refer to general abnormalities detected by inspection of a resist pattern following developing, from directly above the resist pattern, using a surface defect inspection device (brand name: KLA) from KLA Tencor Corporation. Examples of these abnormalities include scum, foam, dust, and bridges across different portions of the resist pattern.

Moreover in recent years, in the formation of very fine resist patterns of 130 nm or smaller using an ArF excimer laser or more recent light source, namely an ArF excimer laser, a $F_2$ excimer laser, EUV or EB or the like, the problems associated with resolving these post-developing resist pattern defects have become even more demanding.

[Patent Reference 1]
Japanese Unexamined Patent Application, First Publication No. 2002-296779

DISCLOSURE OF INVENTION

However, as yet, a chemically amplified positive resist composition that is capable of retaining favorable lithography characteristics, while also enabling a reduction in the level of defects has not been proposed.

The present invention takes the above circumstances into consideration, with an object of providing a chemically amplified positive resist composition that is capable of retaining favorable lithography characteristics, while also enabling a reduction in the level of defects, as well as a process for forming a resist pattern that uses the composition.

In order to achieve the above object, the present invention adopts the aspects described below.

A first aspect of the present invention is a positive resist composition including a resin component (A) that exhibits increased alkali solubility under the action of acid, and an acid generator component (B) that generates acid on irradiation, wherein the component (A) is a copolymer that includes a structural unit (a1) derived from an (α-lower alkyl)acrylate ester that contains a monocyclic or polycyclic group-containing acid dissociable, dissolution inhibiting group, a structural unit (a2) derived from an (α-lower alkyl)acrylate ester that contains a lactone ring, a structural unit (a3) derived from an (α-lower alkyl)acrylate ester that contains a polar group-containing polycyclic group, and a structural unit (a4) represented by a general formula (1) shown below.

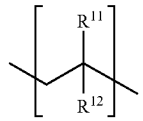

(1)

(wherein, $R^{11}$ represents a lower alkyl group or a hydrogen atom, and $R^{12}$ represents an alkali-soluble group)

In the above structural unit (a4), $R^{12}$ is preferably a carboxyl group.

In the above structural unit (a3), the polar group is preferably an alcoholic hydroxyl group.

The proportion of the above structural unit (a4) within the above component (A) is preferably within a range from 1 to 25 mol %.

The proportion of the above structural unit (a1) within the above component (A) is preferably within a range from 20 to 60 mol %.

The proportion of the above structural unit (a2) within the above component (A) is preferably within a range from 20 to 60 mol %.

The proportion of the above structural unit (a3) within the above component (A) is preferably within a range from 10 to 50 mol %.

A positive resist composition according to the first aspect of the present invention may further include a nitrogen-containing organic compound.

A second aspect of the present invention is a process for forming a resist pattern that includes applying a positive resist composition according to the present invention to a support, conducting a prebake, performing selective exposure, conducting PEB (post exposure baking), and performing alkali developing to form the resist pattern.

The process for forming a resist pattern according to the second aspect of the present invention may further include applying a water-soluble coating formation agent to the resist pattern formed on top of the support, thereby forming a water-soluble coating, and subjecting the laminate including the resist pattern and the water-soluble coating to heat treatment, thereby heat shrinking the water-soluble coating.

A process for forming a resist pattern according to the present invention may also include applying a positive resist composition according to the present invention to a support, conducting a prebake of the positive resist composition and the support, performing selective exposure of the prebaked positive resist composition, conducting PEB (post exposure baking) of the selectively exposed positive resist composition, and performing alkali developing of the PEB-treated positive resist composition to form the resist pattern.

In the present invention, the term "(α-lower alkyl)acrylate" is a generic term that includes α-lower alkyl acrylates such as methacrylate, and/or acrylate. The term "α-lower alkyl acrylate" refers to a structure in which the hydrogen atom bonded to the α-carbon atom of an acrylate has been substituted with a lower alkyl group.

The term "structural unit" refers to a monomer unit that contributes to the formation of a polymer.

Furthermore, the term "structural unit derived from an (α-lower alkyl)acrylate ester" refers to a structural unit that is formed by cleavage of the ethylenic double bond of an (α-lower alkyl)acrylate ester.

Furthermore, the term "exposure" is used as a general concept that includes irradiation with any form of radiation.

The present invention is able to provide a chemically amplified positive resist composition that is capable of retaining favorable lithography characteristics, while also enabling a reduction in the level of defects, as well as a process for forming a resist pattern that uses the composition.

BEST MODE FOR CARRYING OUT THE INVENTION

A positive resist composition of the present invention includes a resin component (A) that exhibits increased alkali solubility under the action of acid, and an acid generator component (B) that generates acid on irradiation.

First is a description of the component (A) contained within the positive resist composition of the present invention.

The component (A) is a copolymer that includes the following four structural units as essential units.

(a1): a structural unit derived from an (α-lower alkyl)acrylate ester that contains a monocyclic or polycyclic group-containing acid dissociable, dissolution inhibiting group.

(a2): a structural unit derived from an (α-lower alkyl)acrylate ester that contains a lactone ring.

(a3): a structural unit derived from an (α-lower alkyl)acrylate ester that contains a polar group-containing polycyclic group.

(a4): a structural unit represented by the general formula (1) shown above.

Structural Unit (a1)

In the structural unit (a1), although there are no particular restrictions on the monocyclic or polycyclic group-containing acid dissociable, dissolution inhibiting group, a group that contains a polycyclic group is preferred. Typically, groups that form a cyclic tertiary alkyl ester with the side-chain carboxyl group of the (α-lower alkyl)acrylic acid are the most widely known, that is, groups that include a monocyclic or polycyclic alicyclic hydrocarbon group, and particularly a polycyclic alicyclic hydrocarbon group, are preferred. The hydrocarbon group is preferably saturated.

Examples of suitable monocyclic alicyclic hydrocarbon groups include groups in which one hydrogen atom has been removed from a cycloalkane or the like. Specific examples include groups in which one hydrogen atom has been removed from cyclohexane or cyclopentane or the like.

Examples of suitable polycyclic alicyclic hydrocarbon groups include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Of these groups, adamantyl groups, norbornyl groups, and tetracyclododecanyl groups are preferred industrially.

More specific examples include the structural units represented by the general formulas (I), (II) and (III) shown below.

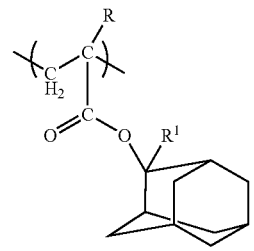

(I)

(wherein, R represents a hydrogen atom or an α-lower alkyl group, and $R^1$ represents a lower alkyl group)

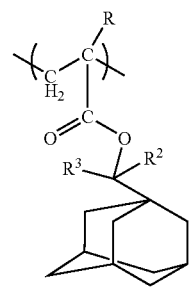

(II)

(wherein, R represents a hydrogen atom or an α-lower alkyl group, and $R^2$ and $R^3$ each represent, independently, a lower alkyl group)

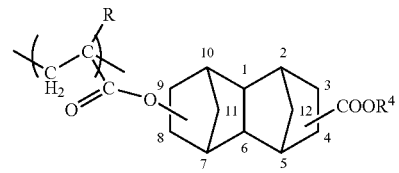

(III)

(wherein, R represents a hydrogen atom or an α-lower alkyl group, and $R^4$ represents a tertiary alkyl group)

In the formulas, the α-lower alkyl group represented by R is preferably a straight-chain or branched alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. From an industrial viewpoint, a methyl group is preferred. This description of the α-lower alkyl group applies to all of the structural units (a1) through (a3), and also to the optional structural unit (a5) described below.

The group $R^1$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, and neopentyl group. Of these, a methyl group or ethyl group is preferred from the viewpoint of industrial availability.

The groups $R^2$ and $R^3$ each preferably represent, independently, a straight-chain or branched lower alkyl group of 1 to 5 carbon atoms. Of these groups, the case in which $R^2$ and $R^3$ are both methyl groups is preferred industrially, and a structural unit derived from 2-(1-adamantyl)-2-propyl (meth) acrylate is a specific example.

The group $R^4$ represents a tertiary alkyl group such as a tert-butyl group or tert-amyl group, although the case in which $R^4$ is a tert-butyl group is preferred industrially.

Furthermore, the group —COOR$^4$ may be bonded to either position 3 or 4 of the tetracyclododecanyl group shown in the formula, although the bonding position cannot be further specified. Furthermore, the carboxyl group residue of the (meth)acrylate structural unit may be bonded to either position 8 or 9 of the tetracyclododecanyl group, although similarly, the bonding position cannot be further specified.

The proportion of the structural unit (a1), relative to the combined total of all the structural units that constitute the component (A), is typically within a range from 20 to 60 mol %, and preferably from 30 to 50 mol %. By ensuring that this proportion is at least as large as the lower limit of the above range, a favorable pattern can be obtained, whereas ensuring that the proportion is no greater than the upper limit of the above range enables a favorable balance to be achieved with the other structural units.

Structural Unit (a2)

Examples of the structural unit (a2) include structural units in which a monocyclic group formed from a lactone ring or a polycyclic alicyclic group that includes a lactone ring is bonded to the ester side-chain portion of an (α-lower alkyl) acrylate ester. The term "lactone ring" refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

Specific examples of the structural unit (a2) include monocyclic groups in which one hydrogen atom has been removed from γ-butyrolactone, and polycyclic groups in which one hydrogen atom has been removed from a lactone ring-containing bicycloalkane.

Specific examples include the structural units represented by the structural formulas (IV) through (VII) shown below.

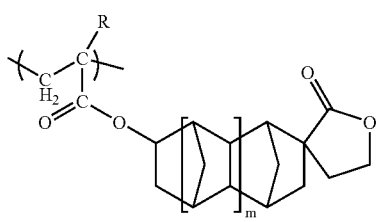
(IV)

(wherein, R represents a hydrogen atom or an α-lower alkyl group, and m represents either 0 or 1)

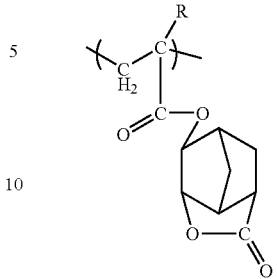
(V)

(wherein, R represents a hydrogen atom or an α-lower alkyl group)

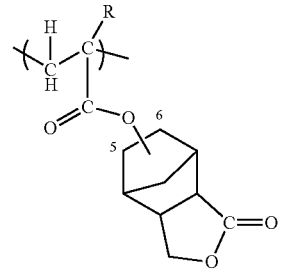
(VI)

(wherein, R represents a hydrogen atom or an α-lower alkyl group)

This structural unit exists as a mixture of the isomers in which the bonding position is either position 5 or position 6.

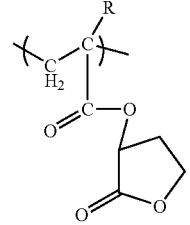
(VII)

(wherein, R represents a hydrogen atom or an α-lower alkyl group)

The proportion of the structural unit (a2), relative to the combined total of all the structural units that constitute the component (A), is typically within a range from 20 to 60 mol %, and preferably from 20 to 50 mol %. Ensuring that this proportion is at least as large as the lower limit of the above range improves the lithography characteristics, whereas ensuring that the proportion is no greater than the upper limit of the above range enables a favorable balance to be achieved with the other structural units.

Structural Unit (a3)

The structural unit (a3) can be selected appropriately from the multitude of structural units proposed for use within resins for photoresist compositions used with an ArF excimer laser, and preferred examples include structural units that include a polar group and a polycyclic alicyclic hydrocarbon group. Examples of this polar group include a cyano group (—CN), a carboxyl group (—COOH) or an alcoholic hydroxyl group (—OH), and of these, an alcoholic hydroxyl group is preferred.

In the structural unit (a3), the polycyclic group can be selected appropriately from the same multitude of polycyclic groups (and preferably polycyclic alicyclic groups) described above in relation to the structural unit (a1).

Specifically, the structural unit (a3) is preferably a unit that includes a hydroxyl group-containing adamantyl group or a carboxyl group-containing tetracyclododecanyl group or the like.

More specific examples include the structural units represented by the general formula (VIII) shown below.

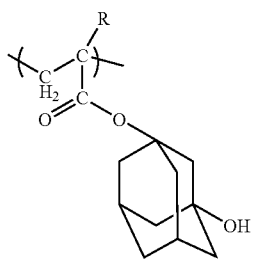

(VIII)

(wherein, R represents a hydrogen atom or an α-lower alkyl group)

The proportion of the structural unit (a3), relative to the combined total of all the structural units that constitute the component (A), is typically within a range from 10 to 50 mol %, and preferably from 20 to 40 mol %. Ensuring that this proportion is at least as large as the lower limit of the above range improves the lithography characteristics, whereas ensuring that the proportion is no greater than the upper limit of the above range enables a favorable balance to be achieved with the other structural units.

Structural Unit (a4)

The structural unit (a4) is represented by the general formula (1) shown above. In the present invention, it is mainly the presence of the structural unit (a4) that causes the defect reduction effect.

In the above general formula (1), $R^{11}$ is a lower alkyl group or a hydrogen atom. The lower alkyl group may be either a straight-chain or branched group, and preferably contains no more than 5 carbon atoms. Specific examples include a methyl group, ethyl group, propyl group, isopropyl group, n-butyl group, isobutyl group, tert-butyl group, pentyl group, isopentyl group, and neopentyl group. From an industrial viewpoint, a methyl group is preferred.

Furthermore, $R^{12}$ is an alkali-soluble group.

The alkali-soluble group is a group with a similar pKa value (acid dissociation constant) to that of a phenolic hydroxyl group, and is typically a group that contains a group such as an alcoholic hydroxyl group or carboxyl group that imparts alkali solubility. In other words, suitable groups are those with a small pKa value (although there are no particular restrictions on the value, ideal pKa values are within a range from 6 to 12). The inclusion of this alkali-soluble group enables a suitable level of acidity to be imparted to the component (A), and it is surmised that this contributes to the observed defect reduction effect.

Specific examples of suitable groups include an alcoholic hydroxyl group, the bonding position of which is not particularly restricted; a hydroxyalkyl group in which the carbon atom at the α-position to an alcoholic hydroxyl group is substituted with an electron withdrawing group; and a carboxyl group. Of these, a carboxyl group is preferred.

In a hydroxyalkyl group in which the carbon atom at the α-position to an alcoholic hydroxyl group is substituted with an electron withdrawing group, examples of the electron withdrawing group include a halogen atom or a halogenated alkyl group or the like.

Suitable halogen atoms include a fluorine atom or chlorine atom or the like, although a fluorine atom is preferred.

Examples of the halogen within a halogenated alkyl group include the same halogen atoms described above. The alkyl group is preferably a lower alkyl group containing, for example, from 1 to 3 carbon atoms, and is preferably a methyl group or ethyl group, and most preferably a methyl group. Specific examples of suitable groups include a trifluoromethyl group, difluoromethyl group, monofluoromethyl group, and perfluoroethyl group, and of these, a trifluoromethyl group is particularly desirable.

The number of electron withdrawing groups may be either 1 or 2, but is preferably 2.

More specific and preferred examples of the aforementioned hydroxyalkyl group in which the carbon atom at the α-position to an alcoholic hydroxyl group is substituted with an electron withdrawing group include groups that contain a —$CR^{31}R^{32}OH$ group, wherein $R^{31}$ and $R^{32}$ each represent, independently, an alkyl group, halogen atom or halogenated alkyl group, and at least one of the groups represents an electron withdrawing group selected from amongst halogen atoms and halogenated alkyl groups.

These halogen atoms and halogenated alkyl groups are the same as those described above, whereas examples of suitable alkyl groups include lower alkyl groups such as a methyl group, ethyl group or propyl group. As described above, the electron withdrawing group is preferably a fluorine atom or fluorinated alkyl group, and cases in which $R^{31}$ and $R^{32}$ are both fluorinated alkyl groups, and in particular trifluoromethyl groups, are particularly desirable from both a synthesis perspective and in terms of the effects achieved.

The proportion of the structural unit (a4), relative to the combined total of all the structural units that constitute the component (A), is typically within a range from 1 to 25 mol %, preferably from 3 to 15 mol %, and is even more preferably at least 3 mol % but less than 10 mol %. Ensuring that this proportion is at least 1 mol % improves the effects of the present invention. A proportion of no more than 25 mol % is preferred in terms of the lithography characteristics.

Other Structural Units

The component (A) may include structural units other than the aforementioned structural units (a1) through (a4), but the combined total of these structural units (a1) through (a4), relative to the combined total of all the structural units that constitute the component (A), is preferably at least 70 mol %, even more preferably 80 mol % or greater, and is most preferably 100 mol %.

A structural unit (a5) besides the structural units (a1) through (a4) may be any other structural unit that cannot be classified as one of the above structural units (a1) through (a4), and there are no particular restrictions.

For example, structural units that contain a polycyclic alicyclic hydrocarbon group, and are derived from an (α-lower alkyl)acrylate ester are preferred. Examples of the polycyclic alicyclic hydrocarbon group include, for example, the same multitude of groups described in relation to the structural unit (a1), and of these, in terms of industrial availability and the like, one or more groups selected from amongst a tricyclodecanyl group, adamantyl group, and tetracyclododecanyl group is preferred.

Specific examples of the structural unit (a5) include units of the structures (IX) to (XI) shown below.

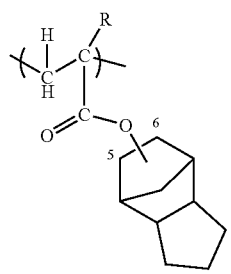

(IX)

(wherein, R represents a hydrogen atom or an α-lower alkyl group)

This structural unit exists as a mixture of the isomers in which the bonding position is either position 5 or position 6.

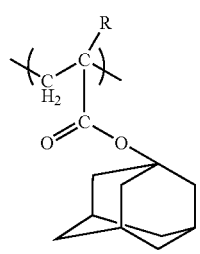

(X)

(wherein, R represents a hydrogen atom or an α-lower alkyl group)

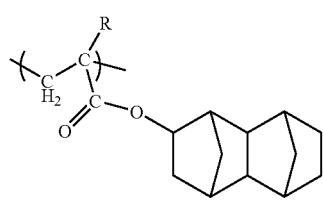

(XI)

(wherein, R represents a hydrogen atom or an α-lower alkyl group)

The proportion of the structural unit (a5), relative to the combined total of all the structural units that constitute the component (A), is typically within a range from 1 to 25 mol %, and preferably from 5 to 20 mol %.

The component (A) may include either a single resin, or a mixture of two or more different resins.

Furthermore, the component (A) can be produced, for example, by a conventional radical polymerization or the like of the monomers corresponding with each of the structural units, using a radical polymerization initiator such as azobisisobutyronitrile (AIBN).

Although there are no particular restrictions on the weight average molecular weight (the polystyrene equivalent weight average molecular weight determined by gel permeation chromatography, this also applies below) of the component (A), the value is typically no more than approximately 12,000, and is preferably no more than 10,000.

There are no particular restrictions on the lower limit, although from the viewpoints of inhibiting pattern collapse and achieving favorable resolution and the like, the weight average molecular weight is preferably at least 4,000, and even more preferably 5,000 or greater.

The quantity of the component (A) within a resist composition of the present invention can be adjusted in accordance with the film thickness of the resist that is to be formed. A typical quantity, expressed as a solid fraction concentration, is within a range from 8 to 25% by weight, and even more preferably from 10 to 20% by weight.

(B) Compound that Generates Acid on Irradiation (Exposure)

In the present invention, the component (B) can use, without any particular restrictions, any of the known so-called acid generators used in conventional chemically amplified resist compositions. Examples of the types of acid generators that have been used are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, and monophenyldimethylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrilea, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl) decane (compound D, decomposition point 147° C.), 1,2-bis (cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

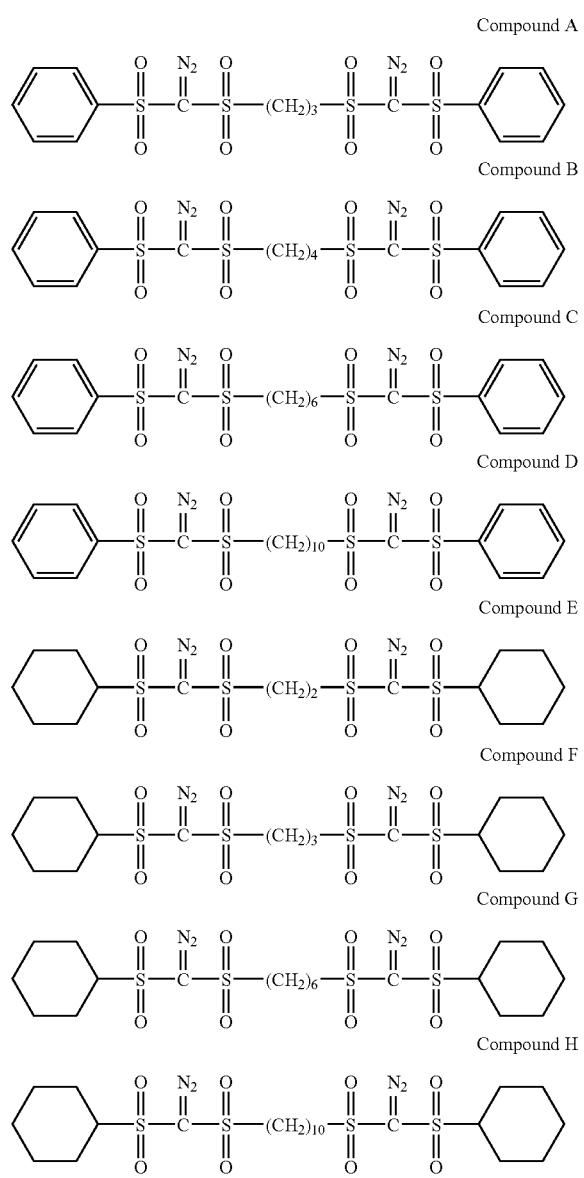

As the component (B), either a single acid generator may be used alone, or a combination of two or more different acid generators may be used.

The quantity used of the component (B) is typically within a range from 0.5 to 30 parts by weight, and preferably from 1 to 10 parts by weight, per 100 parts by weight of the component (A). By ensuring that this quantity is at least as large as the lower limit of the above range, satisfactory pattern formation can be achieved, whereas by ensuring that the quantity is no greater than the upper limit of the above range, a uniform solution can be obtained and favorable storage stability can be achieved.

Nitrogen-Containing Organic Compound (D)

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) can be added as an optional component.

A multitude of these components (D) have already been proposed, and any of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These compounds may be used either alone, or in combinations of two or more different compounds.

The component (D) is typically used in a quantity within a range from 0.01 to 5.0 parts by weight per 100 parts by weight of the component (A).

Component (E)

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof can also be added as another optional component (E) (hereafter referred to as the component (E)). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

A positive resist composition of the present invention can be produced by dissolving the materials that constitute the positive resist composition, namely at least the aforementioned component (A) and component (B), in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used either alone, or as a mixed solvent of two or more different solvents.

Furthermore, mixed solvents of propylene glycol monomethyl ether acetate (PGMEA) and a polar solvent are preferred, and although the blend ratio (weight ratio) in such mixed solvents can be set in accordance with factors such as the co-solubility of the PGMEA and the polar solvent, the ratio is preferably within a range from 1:9 to 8:2, and even more preferably from 2:8 to 5:5.

More specifically, in those cases where EL is added as the polar solvent, the weight ratio PGMEA:EL is preferably within a range from 2:8 to 5:5, and even more preferably from 3:7 to 4:6.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a support such as a substrate or the like, and should be set in accordance with the required coating film thickness, and is typically set so that the solid fraction concentration within the resist composition falls within a range from 2 to 20% by weight, and even more preferably from 5 to 15% by weight.

Other Optional Components

Other miscible additives can also be added to a positive resist composition of the present invention according to need, and examples include additive resins for improving the properties of the resist film, surfactants for improving the ease of application, dissolution inhibitors, plasticizers, stabilizers, colorants, and halation prevention agents.

[Process for Forming Resist Patterns] General Process

A process for forming a resist pattern according to the present invention can be conducted, for example, in the manner described below.

Namely, a positive resist composition described above is first applied to a support such as a silicon wafer using a spinner or the like. Subsequently, this support and the positive resist composition are subjected to a prebake under temperature conditions of 80 to 150° C., for a period of 40 to 120 seconds, and preferably for 60 to 90 seconds. This prebaked positive resist composition is then subjected to selective exposure (irradiation) with an ArF exposure apparatus or the like, by irradiating ArF excimer laser light through a desired mask pattern. Subsequently, the selectively exposed positive resist composition undergoes PEB (post exposure baking) under temperature conditions of 80 to 150° C., for a period of 40 to 120 seconds, and preferably for 60 to 90 seconds. Developing of the PEB-treated positive resist composition is then conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

Application to Shrink Process

A positive resist composition of the present invention can be used favorably within a shrink process detailed below. In other words, even when applied to a shrink process, the composition is able to provide lithography characteristics.

The applicants of the present invention have previously proposed a shrink process that includes the steps of forming a resist pattern on top of a support, forming a water-soluble coating on top of the resist pattern, and then shrinking this water-soluble coating by heat treatment and using the heat shrinkage effect to narrow the resist pattern size (see Japanese Unexamined Patent Application, First Publication No. 2003-107752 and Japanese Unexamined Patent Application, First Publication No. 2003-202679).

The shrink process is a method in which, following the covering of a resist pattern with a water-soluble coating, this water-soluble coating is shrunk by heat treatment, and this heat shrinkage action is used to narrow the spacing of the resist pattern.

A process for forming a resist pattern that includes the conducting of a shrink process can be conducted, for example, in the manner described below.

First, a resist composition of the present invention is applied to the surface of a support such as a silicon wafer using a spinner or the like. Subsequently, this support and positive resist composition are subjected to a prebake under temperature conditions of 80 to 150° C., for a period of 40 to 120 seconds, and preferably for 60 to 90 seconds, thereby forming a resist film. This resist film is then selectively exposed with an ArF excimer laser through a desired mask pattern using, for example, an ArF exposure apparatus. Subsequently, the selectively exposed resist film is then subjected to PEB (post exposure baking) under temperature conditions of 80 to 150° C., for a period of 40 to 120 seconds, and preferably for 60 to 90 seconds. Developing of the PEB-treated resist film is then conducted using an alkali developing solution such as an aqueous solution of tetramethylammonium hydroxide with a concentration of 0.05 to 10% by weight, and preferably from 0.05 to 3% by weight. In this manner, a resist pattern that is faithful to the mask pattern can be obtained.

The support is as described above, and there are no particular restrictions.

As the light source used during the exposure step, although ArF excimer lasers are particularly applicable, other types of radiation, including radiation of longer wavelength such as KrF excimer lasers, and radiation of shorter wavelength such as $F_2$ lasers, EUV (extreme ultraviolet radiation), VUV (vacuum ultraviolet radiation), electron beams, X-rays and soft X-rays can also be used.

Subsequently, following developing of the resist pattern, the shrink process is conducted to narrow the resist pattern size.

In the shrink process, first, a water-soluble coating formation agent containing a water-soluble polymer is applied to the surface of the resist pattern formed on the support, preferably forming a laminate in which the water-soluble coating covers the entire surface of the resist pattern.

Following application of the water-soluble coating formation agent to the resist pattern, the support may be subjected to a prebake at a temperature of 80 to 100° C. for a period of 30 to 90 seconds.

The application of the water-soluble coating formation agent can be conducted using a known method used in the formation of conventional resist layers and the like. In other words, an aqueous solution of the coating formation agent can be applied to the resist pattern using a spinner or the like.

The thickness of the water-soluble coating is preferably either similar to the height of the photoresist pattern, or of a height sufficient to cover the pattern, and is typically within a range from 0.1 to 0.5 µm.

Subsequently, the thus obtained laminate is subjected to heat treatment, causing the water-soluble coating to undergo heat shrinkage. As a result of this heat shrinkage action on the water-soluble coating, the side walls of the resist pattern that contact the water-soluble coating are pulled together, thereby narrowing the spacing (between patterns) of the resist-free portions within the resist pattern. As a result, the pattern can be reduced in size.

In the shrink process, the heat treatment is conducted at a temperature that is sufficient to cause shrinkage of the water-soluble coating, and is conducted at a heating temperature and for a heating period that does not cause fluidization of the resist.

The heating temperature is preferably set to a value that is from 3 to 50° C. lower, and even more preferably 5 to 30° C. lower, than the temperature (the fluidization temperature) at which heat treatment starts to causes spontaneous flow of the resist pattern formed on the support. Moreover, if the shrinking performance of the water-soluble coating is also taken into consideration, then a preferred heat treatment is typically conducted within a temperature range from 80 to 160° C., and preferably from 130 to 160° C.

The fluidization temperature of a resist pattern varies depending on the nature and blend quantities of the components contained within the resist composition.

The heating time varies depending on the heating temperature, but is typically within a range from 30 to 90 seconds.

Subsequently, the water-soluble coating remaining on the resist pattern is removed by washing with an aqueous solvent, and preferably with pure water, for 10 to 60 seconds. The water-soluble coating is easily removed by washing with water, and is able to be completely removed from the support and the resist pattern.

As follows is a description of a water-soluble coating formation agent that is suitable for the above shrink process.

Water-Soluble Coating Formation Agent

The water-soluble coating formation agent contains a water-soluble polymer.

A water-soluble coating formation agent containing this type of water-soluble polymer is ideal for use within a shrink process.

From an industrial viewpoint, this water-soluble polymer is preferably an acrylic-based polymer, a vinyl-based polymer, a cellulose derivative, an alkylene glycol-based polymer, a urea-based polymer, a melamine-based polymer, an epoxy-based polymer or an amide-based polymer, and the use of a polymer containing the following types of monomers as structural units is preferred.

Acrylic-based polymers refer to polymers that contain an acrylic-based monomer, vinyl-based polymers refer to polymers that contain a vinyl-based monomer, cellulose-based polymers refer to polymers that contain a cellulose-based monomer, alkylene glycol-based polymers refer to polymers that contain an alkylene glycol-based monomer, urea-based polymers refer to polymers that contain a urea-based monomer, melamine-based polymers refer to polymers that contain a melamine-based monomer, epoxy-based polymers refer to polymers that contain an epoxy-based monomer, and amide-based polymers refer to polymers that contain an amide-based monomer.

These polymers can be used either alone, or in mixtures of two or more different polymers.

Specific examples of suitable acrylic-based polymers include polymers or copolymers containing structural units derived from monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl-based polymers include polymers or copolymers containing structural units derived from monomers such as morpholine, N-vinylpyrrolidone, vinylimidazolidinone, and vinyl acetate.

Specific examples of suitable cellulose derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol-based polymers include addition polymers or addition copolymers of monomers such as ethylene glycol or propylene glycol.

Specific examples of suitable urea-based polymers include polymers containing structural units derived from monomers such as methylolated urea, dimethylolated urea, and ethylene urea.

Specific examples of suitable melamine-based polymers include polymers containing structural units derived from monomers such as methoxymethylated melamine, methoxymethylated isobutoxymethylated melamine, and methoxyethylated melamine.

In addition, water-soluble epoxy-based polymers and nylon-based polymers can also be used.

Of the above water-soluble polymers, those containing at least one polymer selected from a group consisting of alkylene glycol-based polymers, cellulose-based polymers, vinyl-based polymers and acrylic-based polymers is preferred, and acrylic-based polymers are the most preferred as they also offer simple pH adjustment. In addition, using a copolymer of an acrylic-based monomer and another non-acrylic monomer is preferred, as such copolymers enable efficient narrowing of the photoresist pattern size, while maintaining the shape of the photoresist pattern during the heat treatment.

Water-soluble polymers that include N-vinylpyrrolidone as a proton donor monomer and acrylic acid as a proton acceptor monomer are particularly preferred as they exhibit a particularly large shrinkage ratio on heating. In other words, the water-soluble polymer preferably contains structural units derived from acrylic acid and structural units derived from vinylpyrrolidone.

In those cases where a copolymer is used as the water-soluble polymer, there are no particular restrictions on the relative blend proportions of the structural components, although in the case of a mixture, if long term stability is considered particularly important, then the blend proportion of the acrylic-based polymer is preferably greater than that of the other structural polymers. In order to improve the long term stability, in addition to increasing the proportion of the acrylic-based polymer as described above, an acidic compound such as p-toluenesulfonic acid or dodecylbenzenesulfonic acid can also be added.

The water-soluble coating formation agent preferably also contains a surfactant. There are no particular restrictions on the surfactant, although the surfactant should have properties such that when added to the water-soluble polymer described above, the solubility is good, a suspension does not develop, and co-solubility with the polymer component is favorable. By using a surfactant that satisfies these types of properties, the occurrence of defects, which is thought to be related to the occurrence of microfoam during the application of the water-soluble coating formation agent to the resist pattern, can be effectively prevented.

Specifically, one or more surfactants selected from amongst N-alkylpyrrolidone-based surfactants, quaternary ammonium salt-based surfactants, and polyoxyethylene phosphate ester-based surfactants are preferred.

As the N-alkylpyrrolidone-based surfactant, compounds represented by a general formula (10) shown below are preferred.

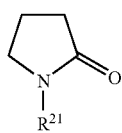

(10)

(wherein, $R^{21}$ represents an alkyl group of 6 or more carbon atoms)

Specific examples of such N-alkylpyrrolidone-based surfactants include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, and N-octadecyl-2-pyrrolidone. Of these, N-octyl-2-pyrrolidone (Surfadone LP100, manufactured by ISP Co., Ltd.) is preferred.

As the quaternary ammonium salt-based surfactant, compounds represented by a general formula (11) shown below are preferred.

(11)

[wherein, $R^{22}$, $R^{23}$, $R^{24}$ and $R^{25}$ each represent, independently, an alkyl group or a hydroxyalkyl group (although at least one of the groups represents an alkyl group or hydroxyalkyl group of 6 or more carbon atoms); and $X^-$ represents a hydroxide ion or a halide ion]

Specific examples of such quaternary ammonium salt-based surfactants include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, and octadecyltrimethylammonium hydroxide. Of these, hexadecyltrimethylammonium hydroxide is preferred.

As the polyoxyethylene phosphate ester-based surfactant, compounds represented by a general formula (12) shown below are preferred.

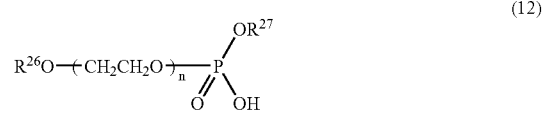

(12)

(wherein, $R^{26}$ represents an alkyl group or alkylallyl group of 1 to 10 carbon atoms; $R^{27}$ represents a hydrogen atom or a $(CH_2CH_2O)R^{26}$ group (wherein $R^{26}$ is as defined above); and n represents an integer from 1 to 20)

Specific examples of such polyoxyethylene phosphate ester-based surfactants include "Plysurf A212E" and "Plysurf A210G", which are commercial products manufactured by Dai-ichi Kogyo Seiyaku Co., Ltd.

The blend quantity of the surfactant is preferably within a range from 0.1 to 10% by weight, and even more preferably from 0.2 to 2% by weight, relative to the total solid fraction of the water-soluble coating formation agent. Blend quantities outside the above range can cause a deterioration in the ease of application, resulting in variations in the degree of pattern shrinkage as a result of a decrease in the in-plane uniformity, and an increased likelihood of defects, which are thought to be closely related to the occurrence of fine bubbles known as microfoam that can be generated during application.

From the viewpoints of preventing impurities and enabling favorable pH adjustment, the water-soluble coating formation agent may also contain an optional water-soluble amine.

Examples of this water-soluble amine include those amines with a pKa value (acid dissociation constant) within a range from 7.5 to 13 in an aqueous solution at 25° C. Specific examples of suitable amines include alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine; polyalkylene polyamines such as diethylenetriamine, triethylenetetramine, propylenediamine, N,N-diethylethylenediamine, 1,4-butanediamine, N-ethyl-ethylenediamine, 1,2-propanediamine, 1,3-propanediamine, and 1,6-hexanediamine; aliphatic amines such as 2-ethyl-hexylamine, dioctylamine, tributylamine, tripropylamine, triallylamine, heptylamine, and cyclohexylamine; aromatic amines such as benzylamine and diphenylamine; and cyclic amines such as piperazine, N-methyl-piperazine, methyl-piperazine, and hydroxyethylpiperazine. Of these water-soluble amines, those with boiling points of 140° C. (760 mmHg) or higher are preferred, and monoethanolamine and triethanolamine and the like are particularly desirable.

In those cases in which a water-soluble amine is added, the quantity of the amine is preferably within a range from 0.1 to 30% by weight, and even more preferably from 2 to 15% by weight, relative to the total solid fraction of the water-soluble coating formation agent. If the quantity is less than 0.1% by weight then there is a danger of a degradation in the solution over time, whereas in contrast, if the quantity exceeds 30% by weight, there is a danger of a deterioration in the shape of the photoresist pattern.

From the viewpoints of reducing the photoresist pattern size and suppressing the occurrence of defects, an additional non-amine-based water-soluble organic solvent may also be added to the water-soluble coating formation agent if desired.

This non-amine-based water-soluble organic solvent may be any non-amine-based organic solvent that exhibits miscibility with water, and suitable examples include sulfoxides such as dimethylsulfoxide; sulfones such as dimethyl sulfone, diethyl sulfone, bis(2-hydroxyethyl) sulfone, and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; and polyhydric alcohols or derivatives thereof such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerol, 1,2-butylene glycol, 1,3-butylene glycol, and 2,3-butylene glycol. Of these non-amine-based organic solvents, from the viewpoints of reducing the photoresist pattern size and suppressing the occurrence of defects, polyhydric alcohols or their derivatives are preferred, and glycerol is particularly preferred. This non-amine-based water-soluble organic solvent can use either a single compound, or a mixture of two or more compounds.

In those cases in which a non-amine-based water-soluble organic solvent is added, the quantity of the solvent is preferably within a range from 0.1 to 30% by weight, and even more preferably from 0.5 to 15% by weight, relative to the water-soluble polymer. If this blend quantity is less than 0.1% by weight then the defect suppression effect tends to weaken, whereas in contrast, if the quantity exceeds 30% by weight, a mixing layer tends to form between the coating and the photoresist pattern, which is undesirable.

The water-soluble coating formation agent is preferably used in the form of an aqueous solution with a concentration of 3 to 50% by weight, and even more preferably from 5 to 20% by weight. If the concentration is less than 3% by weight, a satisfactory coating may not be formed on the substrate, whereas at concentrations exceeding 50% by weight, not only does increasing the concentration not produce an equivalent improvement in the desired effects, but the handling of the agent also becomes more difficult.

As described above, the water-soluble coating formation agent is usually used in the form of an aqueous solution using water as the solvent, although a mixed solvent of water and an alcohol-based solvent can also be used. Examples of this alcohol-based solvent include monovalent alcohols such as methyl alcohol, ethyl alcohol, propyl alcohol, and isopropyl alcohol. The alcohol-based solvent is mixed with the water in quantities of no more than 30% by weight.

By using a water-soluble coating formation agent with the configuration described above within a process for forming a resist pattern that includes a shrink process, the shape of the resulting resist pattern exhibits favorable rectangular formability. In cases where a plurality of resist patterns is formed on a single substrate, irregularities within the pattern shapes caused by variations in the degree of shrinkage are minimal, meaning a resist pattern of uniform pattern size is able to be formed.

In this manner, the present invention is capable of retaining favorable lithography characteristics (including resolution, depth of focus characteristics, and a favorable resist pattern shape and the like), while also enabling a marked reduction in the level of defects.

Although the reasons for these findings are not entirely clear, it is thought that because the solubility of the resist in the developing solution improves as a result of including the structural unit (a4), a more favorable suppression is achieved of the recrystallization of material dissolved in the alkali developing solution that can occur during the rinsing step following developing, thereby enabling better suppression of one of the phenomena responsible for the generation of defects. Moreover, it is surmised that the synergistic effect of including the structural units (a1) through (a4) enables more favorable lithography characteristics to be achieved.

Furthermore, even when applied to a shrink process, lithography characteristics that are similar to those obtained in conventional processes can be achieved.

EXAMPLES

Synthesis Example 1

0.25 mols of a mixture of the monomers p, q, r, and s shown below was dissolved in 500 ml of methyl ethyl ketone (MEK), and 0.01 mols of AIBN was then added to the solution and dissolved. The thus obtained solution was heated to a temperature of 65 to 70° C., and maintained at this temperature for 3 hours. Subsequently, the reaction solution was poured into 3 L of vigorously stirred isopropanol, and the precipitated solid was isolated by filtration.

The thus obtained solid product was dissolved in 300 ml of MEK, poured into 3 L of vigorously stirred methanol, and once again the precipitated solid was isolated by filtration and then dried, yielding a resin 1 with a weight average molecular weight of 10,000, represented by a formula 17 shown below.

| | |
|---|---|
| p: 2-methyl-2-adamantyl methacrylate (a monomer that corresponds with the structural unit of the general formula (I) wherein R is a methyl group and $R^1$ is a methyl group) | 38.1 mol % |
| q: γ-butyrolactone acrylate (a monomer that corresponds with the structural unit of the general formula (VII) wherein R is a hydrogen atom) | 38.1 mol % |
| r: 3-hydroxy-1-adamantyl methacrylate (a monomer that corresponds with the structural unit of the general formula (VIII) wherein R is a methyl group) | 19 mol % |
| s: methacrylic acid | 4.8 mol % |

[Formula 17]

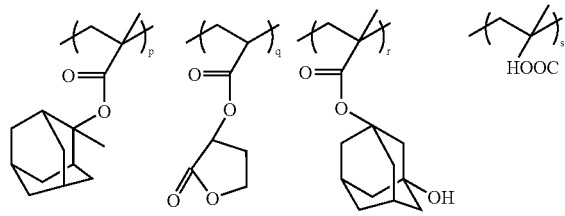

Synthesis Example 2

0.25 mols of a mixture of the monomers p, q, and r shown below was dissolved in 500 ml of methyl ethyl ketone (MEK), and 0.01 mols of AIBN was then added to the solution and dissolved. The thus obtained solution was heated to a temperature of 65 to 70° C., and maintained at this temperature for 3 hours. Subsequently, the reaction solution was poured into 3 L of vigorously stirred isopropanol, and the precipitated solid was isolated by filtration. The thus obtained solid product was dissolved in 300 ml of MEK, poured into 3 L of vigorously stirred methanol, and once again the precipitated solid was isolated by filtration and then dried, yielding a resin 2 with a weight average molecular weight of 10,000, represented by a formula 18 shown below.

| | |
|---|---|
| p: 2-methyl-2-adamantyl methacrylate (a monomer that corresponds with the structural unit of the general formula (I) wherein R is a methyl group and $R^1$ is a methyl group) | 40 mol % |
| q: γ-butyrolactone acrylate (a monomer that corresponds with the structural unit of the general formula (VII) wherein R is a hydrogen atom) | 40 mol % |
| r: 3-hydroxy-1-adamantyl methacrylate (a monomer that corresponds with the structural unit of the general formula (VIII) wherein R is a methyl group) | 20 mol % |

[Formula 18]

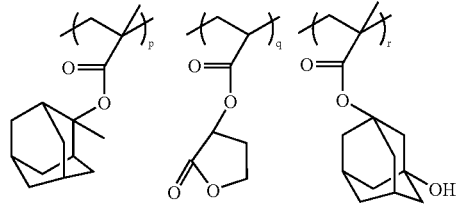

Example 1

A positive resist composition was prepared using the following components.

Component (A): 100 parts by weight of the resin 1, component (B): 3.5 parts by weight of (4-methylphenyl)diphenylsulfonium nonafluorobutanesulfonate, component (D): 0.1 parts by weight of triethanolamine, component (E): 0.1 parts by weight of salicylic acid, organic solvent: a mixed solvent of PGMEA/EL (weight ratio: 6/4) (in sufficient quantity to produce a solid fraction concentration for the resist composition of 8% by weight).

Comparative Example 1

With the exception of altering the component (A) to the resin component listed below, a positive resist composition was prepared in the same manner as the example 1.

Resin Component: Resin 2

(Test Method) (1) Typical Process (Evaluation of Resolution)

An organic anti-reflective film composition ARC-29A (a product name, manufactured by Brewer Science Ltd.) was applied to the surface of an 8-inch silicon wafer using a spinner, and the composition was then baked and dried on a hotplate at 215° C. for 60 seconds, thereby forming an organic anti-reflective film with a film thickness of 77 nm.

The positive resist composition was then applied to the surface of this organic anti-reflective film using a spinner, and was then prebaked (PAB) and dried on a hotplate at 105° C. for 90 seconds, thereby forming a resist layer with a film thickness of 225 nm.

Subsequently, this layer was selectively irradiated with an ArF excimer laser (193 nm) through a (binary) mask pattern, using an ArF exposure apparatus NSR-S306 (manufactured by Nikon Corporation; NA (numerical aperture)=0.78, 2/3 annular illumination).

The resist was then subjected to PEB treatment at 100° C. for 90 seconds, subsequently subjected to puddle development for 60 seconds at 23° C. in a 2.38% by weight aqueous solution of tetramethylammonium hydroxide, and was then washed for 20 seconds with water, and dried, thus forming a resist pattern.

An isolated hole pattern with a hole diameter of 100 nm, and a dense hole pattern with a hole diameter of 100 nm (a pattern in which holes of diameter 100 nm were spaced at 100 nm intervals) were formed. The sensitivity at the time of pattern formation was 31.5 mJ/cm², and was the same for each of the patterns in the example 1. In the comparative example 1, the sensitivity at the time of formation was 32.0 mJ/cm², and once again, was the same for each of the two patterns.

Inspection of the pattern shapes revealed a shape with a high degree of rectangular formability for the isolated hole pattern in both the example 1 and the comparative example 1. In the case of the dense hole pattern, the inside walls of the holes were formed with a slightly wavy rectangular shape.

(Evaluation of Defects)

The positive resist compositions of the example 1 and the comparative example 1 were each applied directly to the surface of an 8-inch silicon wafer using a spinner, and were then prebaked (PAB) and dried on a hotplate at 105° C. for 90 seconds, thereby forming a resist layer with a film thickness of 225 nm in each case.

Subsequently, each layer was selectively irradiated with an ArF excimer laser (193 nm) through a (binary) mask pattern, using an ArF exposure apparatus NSR-S306 (manufactured by Nikon Corporation; NA (numerical aperture)=0.78, 2/3 annular illumination).

Each resist was then subjected to PEB treatment at 100° C. for 90 seconds, subsequently subjected to puddle development for 60 seconds at 23° C. in a 2.38% by weight aqueous solution of tetramethylammonium hydroxide, and a rinse liquid was then dripped onto the resist for 1 second at 1,000 rpm and then for 15 seconds at 500 rpm (enforced conditions for increasing the likelihood of defect occurrence), before the resist was dried to form a resist pattern. In the aforementioned section entitled "evaluation of resolution", a typical rinse process was conducted, in which the rinse liquid was dripped onto the resist for 10 seconds at 2,000 rpm and then for 50 seconds at 1,000 rpm.

Furthermore, the pattern was formed as a dense hole pattern with a hole diameter of 300 nm (a pattern in which holes of diameter 300 nm were spaced at 300 nm intervals).

Subsequently, the resist was measured using a surface defect inspection device KLA2351 (a product name) manufactured by KLA Tencor Corporation, and evaluation of the number of defects within the wafer revealed a value of 515 defects per 8-inch wafer for the example 1, and 9,271 defects per 8-inch wafer for the comparative example 1.

(Depth of Focus Characteristics)

Resist patterns were formed in the same manner as described above in the section entitled "evaluation of resolution", and when the depth of focus (DOF) for formation of an isolated hole pattern with a hole diameter of 100 nm, and the depth of focus (DOF) for formation of a dense hole pattern with a hole diameter of 100 nm (a pattern in which holes of diameter 100 nm were spaced at 100 nm intervals) were determined, the results were 0.15 μm and 0.2 μm respectively for the example 1, and 0.15 μm and 0.2 μm respectively for the comparative example 1.

(2) Shrink Process

Using the positive resist compositions of the example 1 and the comparative example 1, a shrink process was conducted, and when the 5 tests below were conducted, there was no difference between the compositions in each of the five sets of test results.

(i) depth of focus characteristics of an isolated hole pattern, (ii) depth of focus characteristics of a dense hole pattern, (iii) dependency of the amount of shrinkage on the exposure dose, (iv) the proximity effect (in a dense hole pattern, when the hole diameter was fixed at 100 nm and the spacing between holes was varied, the relationship between the spacing and the size of the hole that was actually formed), and (v) the pattern shape.

From the above results, it was confirmed that by using a positive resist composition of the example 1 according to the present invention, the level of defects could be reduced dramatically.

Furthermore, the depth of focus characteristics and the pattern shape were no different from those of the comparative example 1, indicating that conventional levels of characteristics were able to be maintained. Furthermore, even when a shrink process was conducted, the example 1 exhibited no differences from the comparative example 1, confirming that conventional levels of characteristics were able to be maintained.

The invention claimed is:

1. A positive resist composition comprising:
a resin component (A) that exhibits increased alkali solubility under action of acid; and
an acid generator component (B) that generates acid upon irradiation, wherein
said component (A) is a copolymer comprising a structural unit (a1) derived from an (α-lower alkyl)acrylate ester that contains a monocyclic or polycyclic group-containing acid dissociable, dissolution inhibiting group, a structural unit (a2) derived from an (α-lower alkyl)acrylate ester that contains a lactone ring, a structural unit (a3) derived from an (α-lower alkyl)acrylate ester that contains a polar group-containing polycyclic group, and a structural unit (a4) represented by a general formula (1) shown below:

(wherein, $R^{11}$ represents a lower alkyl group or a hydrogen atom, and $R^{12}$ represents a carboxyl group), and
wherein a proportion of said structural unit (a4) within said component (A) is at least 3 mol % but less than 10 mol %.

2. A positive resist composition according to claim 1, wherein in said structural unit (a3), said polar group is an alcoholic hydroxyl group.

3. A positive resist composition according to claim 1, wherein a proportion of said structural unit (a1) within said component (A) is within a range from 20 to 60 mol %.

4. A positive resist composition according to claim 1, wherein a proportion of said structural unit (a2) within said component (A) is within a range from 20 to 60 mol %.

5. A positive resist composition according to claim 1, wherein a proportion of said structural unit (a3) within said component (A) is within a range from 10 to 50 mol %.

6. A positive resist composition according to claim 1, further comprising a nitrogen-containing organic compound.

7. A process for forming a resist pattern, comprising:
applying a positive resist composition according to any one of claims 1, 2, 3, 4, 5 or 6 to a support,
conducting a prebake,
performing selective exposure,
conducting PEB (post exposure baking), and
performing alkali developing to form a resist pattern.

8. A process for forming a resist pattern according to claim 7, further comprising:
applying a water-soluble coating formation agent to said resist pattern formed on top of said support, thereby forming a water-soluble coating, and
subjecting a laminate comprising said resist pattern and said water-soluble coating to heat treatment, thereby heat shrinking said water-soluble coating.

* * * * *